United States Patent [19]

Lathrope

[11] 4,323,796

[45] Apr. 6, 1982

[54] LOW TRANSIENT FEEDTHRU FET SAMPLE AND HOLD GATE

[75] Inventor: Michael F. Lathrope, Oak Forest, Ill.

[73] Assignee: Motorola, Inc., Schaumburg, Ill.

[21] Appl. No.: 116,739

[22] Filed: Jan. 30, 1980

[51] Int. Cl.³ .................... H03K 17/16; H03K 17/687; G11C 27/02
[52] U.S. Cl. .................................. 307/353; 307/572; 307/573
[58] Field of Search .............. 307/352, 353, 571, 572, 307/573

[56] References Cited

U.S. PATENT DOCUMENTS

| | | | |
|---|---|---|---|
| 3,586,880 | 6/1971 | Fitzwater, Jr. | 307/353 |
| 3,646,364 | 2/1972 | Kaminski | 307/572 |
| 3,764,921 | 10/1973 | Huard | 307/353 |
| 3,902,078 | 8/1975 | Peterson | 307/573 |
| 3,942,047 | 3/1976 | Buchanan | 307/297 |
| 4,056,737 | 11/1977 | Sequin | 307/304 |
| 4,138,614 | 2/1979 | Ochi | 307/304 |

Primary Examiner—John Zazworsky
Attorney, Agent, or Firm—James A. Scheer; James W. Gillman

[57] ABSTRACT

An FET sample and hold switching circuit with low transient feedthru in a sample and hold phase detector. The FET OFF voltage is clamped to a value well below the supply voltage thus permitting reduction of stored charge on the interelectrode capacitances. This combined with FET capacitance compensation provides substantial reduction in feedthru and switching transients.

4 Claims, 1 Drawing Figure

LOW TRANSIENT FEEDTHRU FET SAMPLE AND HOLD GATE

BACKGROUND OF THE INVENTION

A. Field of the Invention

This invention relates generally to switching circuits and more particularly to an improved field effect transistor sample and hold switching circuit.

B. Description of the Prior Art

In general, field effect transistors are well suited for use in gate and switching circuits. A common approach utilizes as a switch a junction field effect transistor (JFET) designed to have a low ON resistance. The JFET gate must track the analog signal in the ON state to make sure that the switch stays on. This places severe demands on the gate switching circuits.

A major disadvantage of this use of JFETs in switching circuits has been the incidence of spurious transient responses in the source and drain circuit due to the control or gate signal. These spurious responses, in a form of transients are the result of charging and discharging of interelectrode capacitances between the gate and drain terminals and the gate and source terminals. For example, to switch the FET OFF, substantially the full supply voltage is used, which results in a large amount of interelectrode charge that must be switched to switch the state of the FET.

In the prior art a number of approaches have been utilized to reduce these transients. One method entails the use of complimentary FET devices. The major drawback inherent in this practice resides in the fact that it is prohibitively expensive to manufacture complimentary FETs having identical characteristics. Another prior art method prescribes that the FET be made to have interelectrode capacitances as small as possible. Reducing the physical size of the FET reduces the undesirable parasitic capacitances, but increases the resistance of the device when it is ON, a very undersirable effect in most applications.

SUMMARY OF THE INVENTION

It is an object of the invention to provide an improved FET sample and hold switching circuit which substantially eliminates transient responses.

It is a further object of the invention to provide a FET sample and hold switching circuit that can track the input potential being switched over a wide range of voltage.

It is another object of the invention to provide a FET sample and hold switching circuit which can be easily and economically constructed in integrated circuit form.

Briefly, according to an embodiment of the invention, an FET sample and hold switching circuit utilizes a switching FET with its drain and source forming an input and an intermediate terminal. A capacitor is provided for holding a voltage coupled through the FET from the input when the FET is in the "ON" state. A tracking circuit tracks the voltage on the capacitor and couples the voltage to an output terminal. Also coupled to the tracking circuit and the gate of the FET is a circuit for generating first and second switching voltages. The first switching voltage is substantially equal to the held voltage and the second switching voltage is clamped at a value substantially less than the supply voltage, yet sufficient to switch the FET to the OFF state. A switching means is coupled to the generating circuit to cause the first switching voltage to be generated on the gate of the FET to switch it to the ON state, and to cause the second switching voltage to be generated on the gate of the FET in order to switch it to the OFF state. Clamping the OFF gate voltage to substantially less than the supply voltage minimizes the amount of charging and discharging of the interelectrode capacitances required to switch the FET, thereby greatly reducing switching transients.

According to another feature of the invention, a second FET of identical size, has its drain and source shorted together and coupled to the FET source. A generating circuit is coupled to the gate of the second FET for generating a potential on the gate which is the opposite of that applied to the gate of the first FET. This results in a substantial reduction of the amount of transient response because the interelectrode capacitances of the second JFET compensate for the capacitance of the switching JFET.

It can be seen that the invention reduces switching transients by reducing the amount of charge which must be switched, and by providing capacitance compensation. The overall result is a FET sample and hold gate, with substantially reduced transient response and reduced manufacturing cost.

The features of the present invention which are believed to be novel are set forth with particularity in the appended claims. The invention, together with further objects and advantages thereof, may best be understood by reference to the following descriptions when taken in conjunction with the accompanying drawings.

DESCRIPTION OF THE PREFERRED EMBODIMENT OF THE INVENTION

Figure 1:
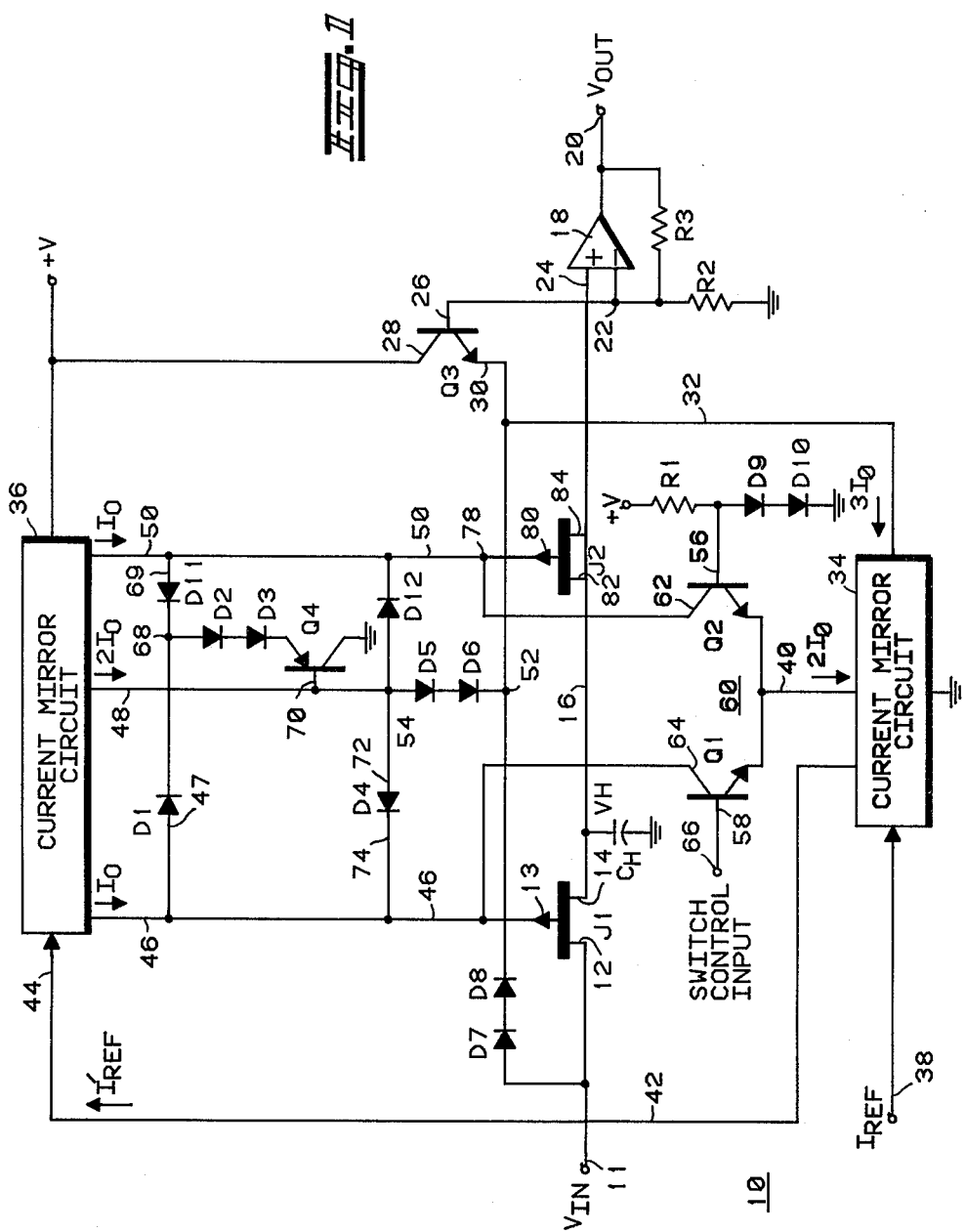
FIG. 1 is a schematic diagram of the preferred embodiment of the switching circuit constructed in accordance with the invention.

Referring now to FIG. 1, a field effect transistor sample and hold switch circuit 10 is shown which has been constructed in accordance with the present invention. Switch circuit 10 includes an input 11 to which an input voltage $V_{in}$ is applied. This voltage is coupled directly to the drain 12 of a p-channel junction field effect transistor (JFET) J1 which has a very low impedance from the drain 12 to the source 14 when in the ON state, and a very high impedance when in the OFF state. Therefore, when the JFET J1 is in the ON state, the signal $V_{in}$ will be coupled directly to the source 14. A capacitor $C_H$, which is a holding capacitor, is coupled to the source 14 of the JEFT J1 as shown. As a result, capacitor $C_H$ will be charged to the value of the voltage $V_{in}$ when the JFET J1 is ON and will hold that value when the JFET J1 is OFF. Thus the circuit is particularly adapted to serve as a sample and hold gate. The value of the voltage on capacitor $C_H$ is therefore conveniently referred to as $V_H$.

The drain 14 and capacitor $C_H$ are also coupled via the line 16 to the noninverting input of a differential amplifier 18. From the output 20 of the differential amplifier 18 to the inverting input 22 is a feedback resistor network composed of resistors R2 and R3. In addition to coupling the voltage $V_H$ to the output 20, the differential amplifier 18, together with its feedback network, performs the function of a voltage following (or tracking) circuit. The amplifier 18 operating in the conventional manner produces a voltage at the inverting input 22 which follows the voltage applied to the noninverting input 24 thereby acting as a voltage tracking circuit. This followed or tracked voltage is coupled to the base 26 of a transistor Q3. The collector 28 of the transistor Q3 is coupled to the supply voltage while the emitter 30 is coupled to the line 32 of the current mirror 34.

The current mirror circuit 34, as well as the current mirror circuit 36 (to be discussed below), are conventional current mirrors. These circuits are used as current sources as is commonly done in the integrated circuit art. In the case of the current mirror circuit 34, an input reference current is applied at the input 38. Based on this reference current, the current mirror circuit 34 generates a current through line 32 equal to three times a predetermined current $I_O$ where $I_O$ is determined by the reference current. In addition, the current mirror circuit 34 generates a current equal to two times the current $I_O$ in the line 40. Finally, the current mirror circuit 34 generates a second reference current, $I'_{REF}$ through the line 42 which is applied to the current mirror circuit 36 at its input 44. This input current to the current mirror circuit 36 is used as a reference to generate a current equal to $I_O$ for the lines 46 and 50 as well as a current equal to two times $I_O$ through the line 48. The use of current mirror circuits in this manner as current sources is common practice in the electronics art.

Returning now to the transistor Q3, the emitter 30 is coupled not only to the line 32, but also to a node 52. Since the voltage applied to the base 26 of transistor Q3 tracks $V_{in}$, and since there will be a voltage drop across the base-emitter 30 of transistor Q3 equal to one diode drop (approximately 0.7 v), a potential of approximately $V_H - 0.7$ v will be maintained at the emitter 30. Consequently, the potential at node 52 will also be approximately $V_H - 0.7$ v.

A differential amplifier pair composed of transistors Q1 and Q2 is located generally at 60. The base 56 of the transistor Q2 is coupled to a network composed of the resistor R1 and the diodes D9 and D10 with resistor R1 being connected to a source of potential +V, as shown. This network maintains a bias voltage of approximately 1.4 volts on the base 56 of transistor Q2. The emitters of both Q1 and Q2 are coupled to the line 40 in which a current of $2I_O$ is maintained by the current mirror circuit 34. The collector 62 of the transistor Q2 is coupled to the line 50 in which a current of $I_O$ is maintained by the current mirror circuit 36. The collector 64 of transistor Q1 is coupled to the line 46 in which a current $I_O$ is maintained by the current mirror circuit 36. Finally, the base 58 of transistor Q1 is coupled to the switch control input node 66.

The differential amplifier pair 60 performs the switch control function for the circuit. When a low (OFF) voltage (approximately 0.7 volt) is applied to the control input 66, the transistor Q1 will be OFF and the transistor Q2 will be ON. As a result, no current will flow through the transistor Q1 and the current $I_O$ in the line 46 will have to flow through the diode D1 coupled from the line 46 to the node 68 as shown. This current $I_O$ will consequently flow down through diodes D2 and D3 and through a transistor Q4 which are coupled in series from the node 68 to ground as shown. At the same time the current $2I_O$ will be flowing down through the line 48 from current mirror circuit 36. Since the line 48 is coupled directly to the node 54, a current will flow through the two diodes D5 and D6 which are coupled in series from the node 54 to the node 52.

As described previously, the voltage at node 52 is maintained at a voltage equal to V minus one diode drop ($V_H - 0.7$ v). Since there is a current flowing through the diodes D5 and D6, which maintains forward biasing, the voltage at the node 54 is held at a voltage equal to $V_H$ plus one diode drop (approximately $V_H + 0.7$ v). The base 70 of the transistor Q4 is coupled directly to the node 54 and is therefore also maintained at a voltage equal to $V_H$ plus one diode drop. Since there is a current flowing through the diodes D1, D2, D3 and the emitter of the transistor Q4, these diodes are all forward biased and therefore there is a total of four diode drops from the anode 47 of diode D1, which coupled to the line 46, to the base 70 of the transistor Q4. Thus the potential maintained at the anode 47 of the diode D1 will be $V_H$ plus five diode drops (approximately $V_H + 3.5$ v).

As a consequence of the above analysis, it can be seen that the potential on the gate 13 of the JFET J1 will be $V_H$ plus five diode drops since the anode 47 of diode D1 is coupled directly to the gate 13 of the JFET J1. This maintains the JFET J1 in an OFF condition wherein it presents a high impedance. It is important to note that the potential on the gate 13 during the OFF condition is clamped at only a small amount (approximately 3.5 volts) above the voltage VH and well below the supply voltage. This voltage is chosen to be only a small increment greater than the potential needed to turn the JFET J1 OFF. Thus in accordance with one feature of the invention, a reduction of switching transients is provided, since only a small voltage swing is required for switching and consequently, a reduction of stored charge on the interelectrode capacitances is obtained.

Referring back to the control differential amplifier 60, if a high (ON) voltage (approximately three diode drops or 2.1 v) is applied to the control input 66, then the transistor Q1 will be turned ON and the transistor Q2 will be turned OFF. In this situation no current will flow through transistor Q2 and a current of $2I_O$ must flow through the transistor Q1 since a current of $2I_O$ is maintained by the current mirror 34 in the line 40 to which the emitter of the transistor Q1 is coupled. A current of $I_O$ is supplied through the line 46 from the current mirror circuit 36 through the collector 64 of the transistor Q1. A diode D4 with its anode 72 coupled to the node 54 and its cathode 74 connected to the line 46 becomes forward biased to provide a path for a current $I_O$ to flow from line 48 to line 46. This current flows down through the collector 64 of the transistor Q1. This results in a total current of $2I_O$ through the transistor Q1.

As discussed above, the potential at node 54 is approximately $V_H$ plus one diode drop. Since the diode D4 is forward biased, the potential of the cathode 74 of diode D4 is approximately $V_H$. Therefore, the potential of the gate 13 of the JFET J1, which is coupled directly to the cathode 74 of diode D4, is also approximately $V_H$.

As can be seen from the foregoing analysis, when a high (ON) voltage is applied to the switch control input 66, the potential on the gate 13 of JFET J1 is held at approximately $V_H$, which maintains the transistor in an ON state in which it acts as a low impedance. During this ON state, the voltage $V_{in}$ is, as a result of the ON condition of the FET J1, coupled directly through to the amplifier 18 and consequently to the output node 20.

In addition, the capacitor C is charged to $V_{in}$ so that the voltage $V_H$ is equal to $V_{in}$. When the JFET J1 is subsequently turned off, the voltage $V_H$ is held on the capacitor $C_H$.

Two diodes in series, D7 and D8, are coupled from the input 11 to the node 52. These diodes are of importance when the JFET J1 is in the OFF state. If, during the OFF condition, the input voltage $V_{in}$ rises substantially above $V_H$, then the potential $V_H$ plus five diode drops maintained on the gate 13 of the JFET J1 may not be sufficient to maintain the FET J1 in the OFF state. However, if the voltage $V_{in}$ becomes equal to or greater than $V_H$ plus one diode drop, then the diodes D7 and D8 will become forward biased and will maintain the potential at the node 52 at a level equal to $V_{in}$ minus two diode drops. With this voltage maintained at the node 52, the potential on the gate 13 will be maintained in the manner described above at a level equal to $V_{in}$ plus four diode drops. This will maintain the gate voltage at a level sufficient to keep the JFET J1 in the OFF state.

In accordance with yet another feature of the present invention, in order to further reduce the switching transients associated with the switching of the JFET J1, a second p-channel JFET J2 can be connected with its gate 80 connected to node 78, and its drain 82 and source 84 shorted together and connected to line 16, as shown in FIG. 1. The JFET J2 is a compensation device chosen to be matched to the JFET J1 so that its interelectrode parasitic capacitances are equal to those of the JFET J1. In this manner, an exact opposite switching voltage will be applied to the gate of the JFET J2 when the JFET J1 is being switched. This will cause the capacitive transients of the JFET J1 to be cancelled by the capacitive effect of the JFET J2. It should be noted that other elements coupled from node 78 to the line 16 could be used (such as a capacitor), if the capacitance is approximately equal to the interelectrode capacitance of the JFET J1.

The potential applied to the gate 80 of compensating JFET J2 is generated in the following manner. When a low or OFF voltage is applied to the switch control input 66, the transistor Q2 of the differential pair 60 will be ON resulting in a current of $2I_O$ flowing down through transistor Q2. As a result, the current $I_O$ in line 50 will flow through the collector 62 and through transistor Q2. Another current equal to $I_O$ will flow from line 48 through diode D12, which is coupled from the node 54 to line 50, as shown, and through the transistor Q2. This results in the diode D12 being forward biased. Since the potential at node 54 is equal to approximately $V_H$ plus one diode drop, the voltage at node 78, to which diode D12 is directly coupled, will be equal to approximately $V_H$. As discussed above, during this OFF condition, the potential on the gate 13 of the JFET J1 is equal to $V_H$ plus five diode drops.

For the opposite condition when the voltage on the control input 66 is high or ON, the transistor Q2 will be in the OFF state and no current will be flowing through it. Since the current $I_O$ in line 50 cannot now flow through Q2, it flows through the diode D11, which is coupled with its anode 69 connected to the line 50 and its cathode connected to the node 68. This current $I_O$ will then flow down through D2, D3 and Q4 to ground, as has been previously described, the potential at the base 70 of the transistor Q4 is equal to $V_H$ plus one diode drop. Since it can be seen that the diodes D11, D2 and D3, and the emitter diode of the transistor Q4 are all forward biased, it is apparent that the potential at the anode 69 of the diode D11 will be at a potential of four diode drops above that of the base 70 of transistor Q4. Consequently, since the potential at the base 70 of the transistor Q4 is $V_H$ plus one diode drop as described above, the potential coupled to the gate 80 of the JFET J2 will be equal to $V_H$ plus five diode drops. During this same time, the potential on the gate 13 of the JFET J1 is equal of $V_H$.

From the above analysis, it can be seen that the potential applied to the gate 80 of the compensating JFET J2 is the exact inverse of the potential applied to the gate 13 of JFET J1. As a consequence of this and of the fact that the interelectrode capacitance of JFET J2 will be substantially the same as that of the JFET J1, the switching transients resulting from the charge transfer from the interelectrode capacitances of the JFET J1 will be largely cancelled by the compensating effect of JFET J2. This together with the clamping of the OFF voltage to a voltage only slightly greater than that needed to maintain the transistor in the OFF state, results in a switching circuit in which the switching transients are largely eliminated. In addition, the circuit, which is adapted to sample and hold an input voltage, is one which is easily integratable. Thus, an improved switching circuit is provided which is particularly suited for use as a sample and hold gate and which exhibits substantially reduced switching transients as well as being economical to manufacture.

While a preferred embodiment of the invention has been described and shown, it should be understood that other variations and modifications may be implemented. It is therefore contemplated to cover by the present application any and all modifications and variations that fall within the true spirit and scope of the basic underlying principles disclosed and claimed herein.

What is claimed is:

1. A low transient feedthru FET sample and hold switching circuit, having a supply voltage, and having an input terminal to which an input voltage is applied, comprising:
   a. a switching FET, having a gate, and having a source and a drain coupled to a pair of terminals forming an input terminal and an intermediate terminal, said switching FET acting as a relatively high impedance between the input and intermediate terminals when it is in an OFF state and acting as a relatively low impedance between the input and the intermediate terminals when it is in an ON state;
   b. means coupled to the intermediate terminal, for holding the voltage which is applied to the input terminal and coupled through the switching FET to the intermediate terminal when the FET is in the ON state;
   c. means coupled to the intermediate terminal and to an output terminal, for tracking the voltage on the holding means and coupling the held voltage to the output terminal;
   d. generating means, having a switch control input, and coupled to the tracking means and the FET gate, for generating a first switching voltage which is substantially equal to the held voltage and, for generating a second switching voltage which is substantially less than the supply voltage while sufficient to switch the FET to the OFF state, and for switching said generating means, in response to a predetermined switching signal at the switch control input, such that the first voltage is generated to switch the FET to the ON state and the second voltage is generated to switch the FET to the OFF state;

e. diode means, coupled from the input terminal to the generating means, for maintaining the second switching voltage at a predetermined increment above the input voltage in response to the input voltage rising above the voltage on the holding means while the switching FET is in the OFF state.

2. The low transient feedthru FET sample and hold switching circuit of claim 1, wherein the holding means is a capacitor.

3. The low transient feedthru FET sample and hold switching circuit of claims 1 or 2 further comprising:

compensation means, coupled to the intermediate terminal, for providing capacitance equal to the interelectrode capacitance of the switching FET; and wherein generating means further comprises means for switching the generating means such that the first switching voltage voltage is applied to the compensation means when the fET is switched to the ON state and the second switching voltage is applied to the compensation means when the FET is switched to the OFF state.

4. The low transient feedthru sample and hold switching circuit of claim 3 wherein the compensation means is a second FET having a gate drain and source with the source and drain shorted together and coupled to the intermediate terminal and the gate coupled to the switching means.

* * * * *